United States Patent [19]

Ikeya et al.

[11] Patent Number: 5,562,473
[45] Date of Patent: Oct. 8, 1996

[54] SOCKET APPARATUS HAVING IMPROVED CONTACT SYSTEM

[75] Inventors: Kiyokaza Ikeya, Suntoh-gun; Osamu Yamazaki, Matsuda-machi, both of Japan

[73] Assignee: Texas Instruments Incorporated, Dallas, Tex.

[21] Appl. No.: 294,299

[22] Filed: Aug. 23, 1994

[30] Foreign Application Priority Data

Sep. 20, 1993 [JP] Japan ..................... 5-256559

[51] Int. Cl.$^6$ ............................................. H01R 13/62
[52] U.S. Cl. ................................. 439/331; 439/72
[58] Field of Search ........................ 439/70, 71, 72, 439/73, 330, 331, 525, 526, 372

[56] References Cited

U.S. PATENT DOCUMENTS

| 4,758,176 | 7/1988 | Abe et al. | 439/331 |
| 4,940,432 | 7/1990 | Consoli et al. | 439/862 |
| 5,120,238 | 6/1992 | Marks et al. | 439/331 |
| 5,244,404 | 9/1993 | Kishi et al. | 439/331 |
| 5,326,271 | 7/1994 | Kishi et al. | 439/331 |
| 5,329,227 | 7/1994 | Sinclair | 439/331 |
| 5,336,096 | 8/1994 | Ozawa et al. | 439/72 |

*Primary Examiner*—Hien D. Vu
*Attorney, Agent, or Firm*—Russell E. Baumann; Richard L. Donaldson; Rene' E. Grossman

[57] ABSTRACT

A socket (100) for the temporary mounting of an electric part such as an IC package (130) for burn-in testing and the like is shown in which a plurality of contact elements (10, 10') are mounted in the socket each having a stationary part (10a), a spring cantilever arm part (10b) and a contact edge part (10e). The contact elements (10, 10') are mounted so that the leads (130a) of an IC package (130) are each received on a respective contact edge part (10e). When the cover (102) of the socket is closed, wall member (105a) engages the top portion of the leads (130a) and exerts a generally vertical downward force on the contact edges (10e) causing them to be depressed to effect electrical connection between leads (130a) and respective contact elements (10, 10').

6 Claims, 6 Drawing Sheets

PRIOR ART

PRIOR ART

FIG. 3

PRIOR ART

SOCKET APPARATUS HAVING IMPROVED CONTACT SYSTEM

BACKGROUND OF THE INVENTION

This invention relates generally to electrical sockets which mount an electrical part having a plurality of leads, such as an IC package, for burn-in testing or the like of the electrical part and more specifically to such sockets which readily mount and dismount an electrical part and which have an improved contact system for making electrical engagement with the leads of the electrical part.

It is conventional in manufacturing IC packages comprising a plastic sealed semiconductor integrated circuit chip (also hereinafter referred to as an IC chip) to subject the packages to a type of reliability test which is called a burn-in test prior to shipment in order to separate the packages into groups of satisfactory and unsatisfactory products. The burn-in test is for the purpose of placing an IC package that has passed a functional test in an oven and energizing the same for a given period of time at an elevated temperature, such as 120° centigrade, under an electrical source which is approximately 20% higher than the rated value. Those IC packages which fail the burn-in test are discarded as unsatisfactory products and only those others which continue to function in a normal fashion are shipped out as satisfactory products.

Figure 1:
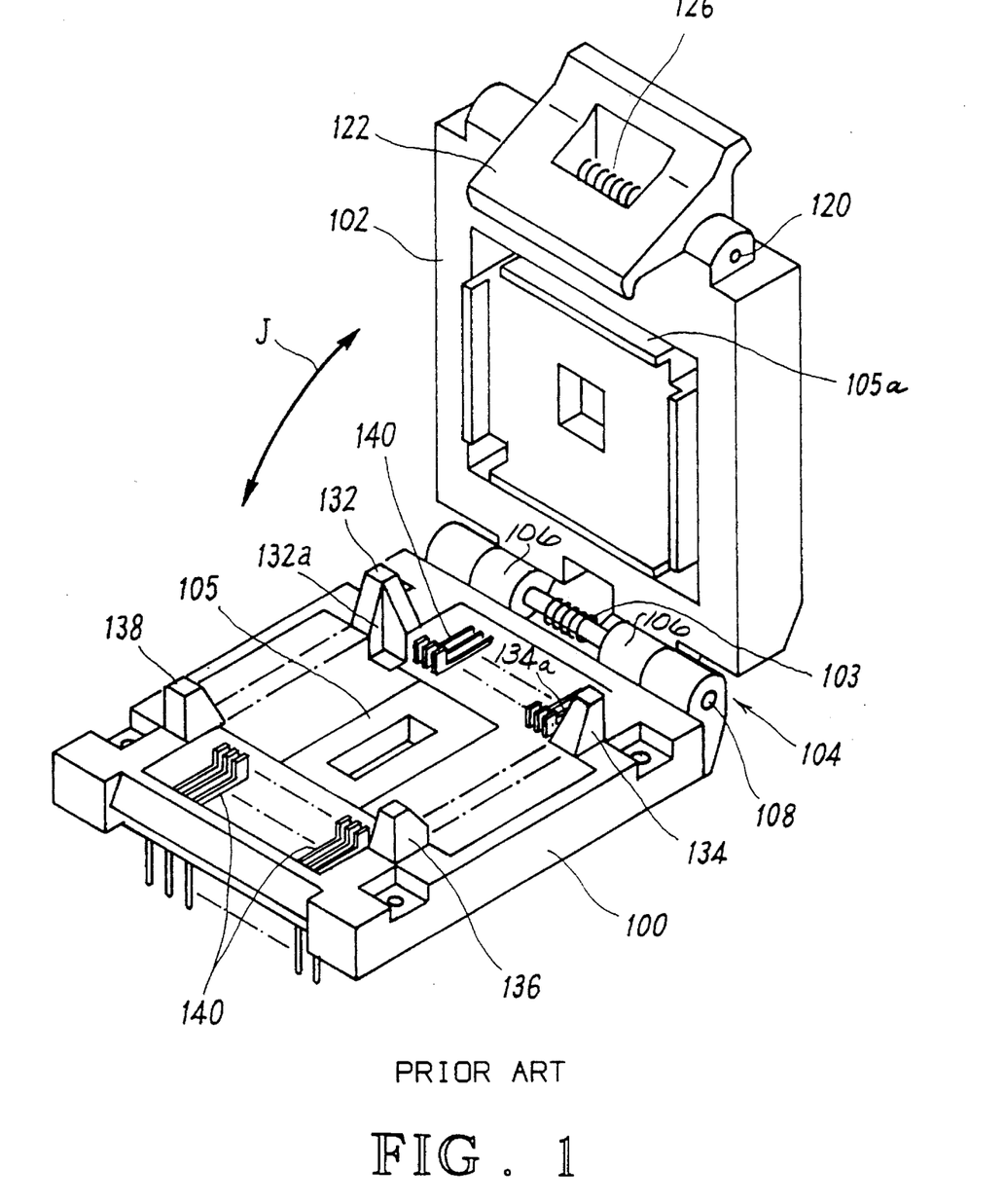
FIG. 1 is a perspective view of a conventional socket used for performing burn-in tests of electrical parts such as IC packages.
Figure 2:
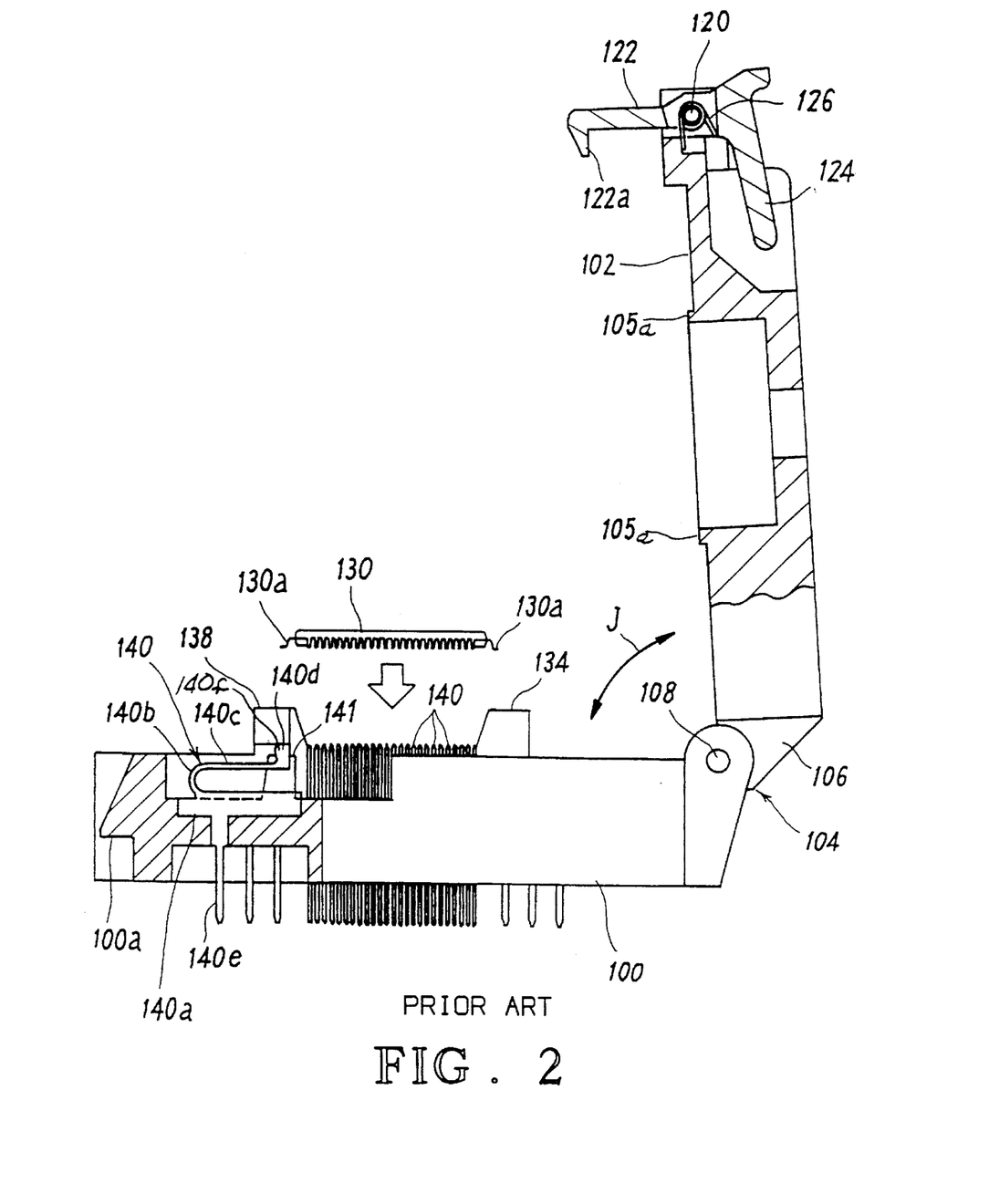
FIG. 2 is a side elevational view of the FIG. 1 socket, partially in cross section, shown with an IC package ready for mounting therein.

An example of a prior art socket used for mounting IC packages for burn-in testing is shown in FIGS. 1 and 2. As seen in FIG. 1, the socket comprises a base 100 which serves as the main socket body to be fixed on a printed circuit substrate (not shown in the drawings) and a cover 102 hingedly mounted thereon. Hinge 104, having a coil spring 103, is disposed on one side of base 100 with bosses 106 of hinge 104 formed integrally on one side of the cover. Cover 102 is pivotable in a direction indicated by an arrow marked J about shaft 108.

In FIG. 2, a rotatable shaft 120 is journaled on the opposite side of cover 102 and mounts thereon a latch 122 for holding cover 102 in a closed state covering base 100. As hook 122a of latch 122 engages with a ledge 100a formed on the opposite side of base 100, cover 102 is closed on the upper surface of base 100. A lever 124 which is integral with latch 122 extends in the opposite direction and, as lever 124 is rotated in opposition to a coil spring 126, latch 122 is disengaged from ledge 100a of base 100, thereby making it possible for cover 102 to be opened.

The upper surface of base 100 is formed in such a way that an IC package 130 of the QFP type (Quad in line Flat Package) may be mounted at the IC package mounting position 105 at the center of the base. On the upper surface of base 100, four guides 132, 134, 136 and 138 extend upwardly in close proximity to the IC package mounting position. The two side surfaces inside a pair of guides 132 and 134 which face each other constitute inclined surfaces 132a, 134a, forming a tapered groove to guide IC package 130.

A large number of contacts 140 are provided in single rows on the upper surface of base 100 in such a fashion as to correspond to the row of leads of each side of IC package 130 receivable between two adjacent guides 132, 134; 134, 136; 136, 138 and 138, 132. A partition wall 141 is formed between each pair of adjacent contacts 140 in order to prevent the contacts from engaging each other.

Contacts 140 may be prepared by punching a thin plate of suitable material such as beryllium copper into a stationary part 140a which is fixed to base 100, a spring part 140b which extends upwardly in a curved direction from the top of stationary part 140a, a spring part 140c which extends straight in a horizontal direction from the top of curve spring part 140b, a contact part 140d which extends upwardly at a right angle from the tip of the straight line spring part and a socket terminal pin 140e which extends downwardly from the bottom of the stationary part 140a perpendicular to the bottom surface of the base and which protrudes therethrough. The upper edge of the contact part 140d functions as a contact edge 140f.

When IC package 130 is guided by grooves 132a and 134a and set at IC package mounting position 105, the tip of each lead 130a of IC package 130 is placed on a respective contact edge 140f of contacts 140. When the cover 102 is closed in this state, the force applying wall members 105a formed on four sides of the inner surface of the cover 102 engage the upper side of the tips of leads 130a of IC package 130, with a result that IC package 130 is pressed downwardly in opposition to the spring force of springs 140b and 140c of contacts 140.

Figure 3:
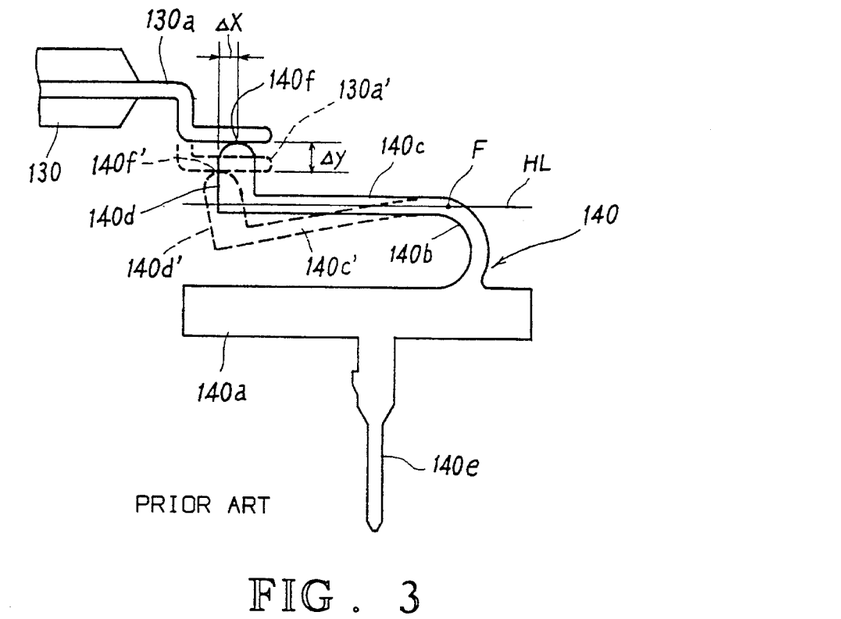
FIG. 3 is a view showing the construction and function of a prior art contact element used in the socket of FIGS. 1

As shown by a dashed line in FIG. 3 and the depressed position noted by a prime added to the numerals of the various movable parts, the straight line spring part 140c of contact 104 pivots downwardly about fulcrum F as the center with both contact edge 140f and lead 130a depressed by a prescribed distance of delta y and, along with this, the point of engagement of contact edge 140f shifts toward the base of the lead by a horizontal distance of delta x, thereby rubbing lead 130a. Due to the rubbing of contact edge 140f a film of oxide is peeled off the 10 surface of lead 130a, thereby enhancing the electrical connection between lead 130a and contact 140.

In sockets made in accordance to the prior art in which the contact elements are pivoted by force exerted through the leads of an electrical part when mounting the electrical part as described above, contact edges 140f engage leads 130a at a position restricted at all times to one side of an imaginary horizontal line HL passing through fulcrum F (center of revolution of contacts 140), i.e., above line HL in the example shown in FIG. 3. Because of this, the moving vector in the horizontal direction of each contact edge 140f is always in one direction (a direction toward the base side of the lead in the example shown in FIG. 3) with a concomitant large displacement delta x of the movement of contact edge 140f.

As contact edges 140f of contacts 140 move in sliding engagement with leads 130a, however, a shearing force is added to leads 130a which increases in proportion to the quantity delta x of the displacement of contact edges 140f.

In view of the fact that, in the case of the conventional socket, the quantity delta x of the displacement of contact edges 140f of contacts 140 is large, a large shearing force is applied to leads 130a, with concomitant danger of permanently deforming leads 130a or peeling off the plating on the surface of the leads.

Figure 4:
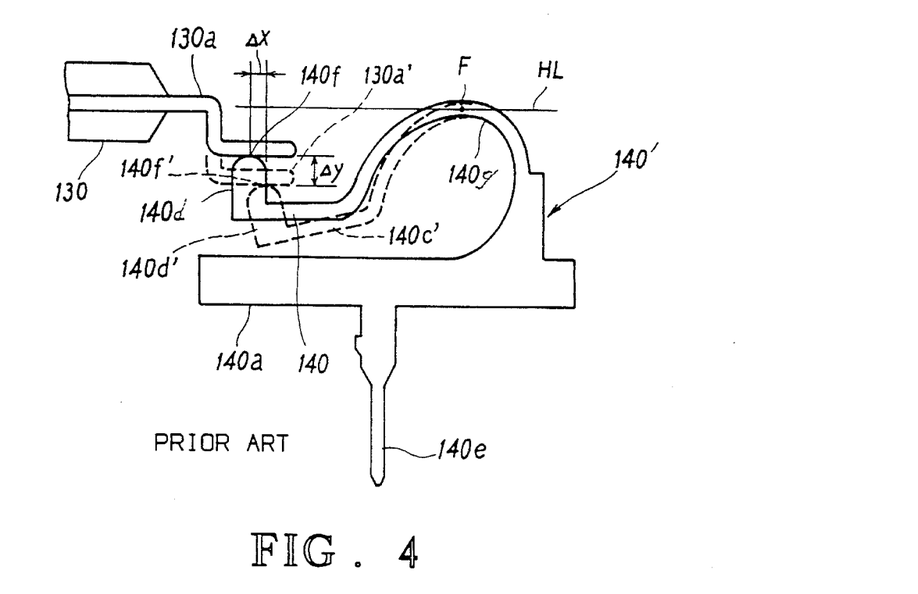
FIG. 4 is a view similar to FIG. 3 of another type of prior art contact element used in the socket of FIGS. 1 and 2.

FIG. 4 shows the construction of another prior art contact element in which contact edge 140f of contact 140' that engages lead 130a is adapted to shift to positions due to an extended curved spring part 140g which are always below horizontal line HL in which the fulcrum F (center of the revolution) of contact 140' lies, with a result that the movement vector in the horizontal direction of contact edge 140f is always in the direction toward the tip of the lead. As in the case of the FIG. 3 structure, the amount of displacement delta x of contact edge 140f of contact element 140', restricted to one direction is large, so that a similar disadvantage as described above is also characteristic of this type.

In sockets made according to the prior art as described above, if the amount of "depression", i.e., the amount of vertical displacement delta y, is set small in order to minimize the amount of the horizontal displacement delta x, there will be a concomitant reduction in the spring return force of contact element 140 or 140', resulting in another disadvantage in that it becomes more difficult to obtain sufficient compressive force for obtaining a suitable electrical connection.

SUMMARY OF THE INVENTION

It is therefore an object of the invention to provide a socket having a contact system which is not subject to the prior art disadvantages mentioned above. Another object is the provision of a socket which results in a satisfactory electrical connection while avoiding deleterious deformation of the terminal leads of the electrical part being tested.

Briefly, according to the invention, a main socket body for mounting a selected electrical part in such a way that the electrical part can be easily mounted or dismounted has a plurality of contact elements provided at a pitch corresponding to the pitch of a plurality of leads of the electrical part. Each contact element has a cantilever arm shaped spring part which is capable of pivoting within a selected space with a prescribed fulcrum as the center and a contact edge for engaging each terminal lead of the electrical part so that when the electrical part is mounted on the main socket body, the spring part of each of the contact elements pivots in the prescribed space by force exerted through a respective electrical part lead and the contact edge makes an alternating motion in opposite directions, thereby rubbing each respective terminal lead of the electrical part.

According to the invention, as the cantilever arm-shaped spring part of the contact element pivots around the fulcrum as the center of the force exerted through a respective lead of the electrical part, the point of engagement of the contact edge of the contact element moves across an imaginary line which is generally perpendicular to the direction of force and in which the fulcrum lies while maintaining engagement with the terminal lead of the electric part. At this juncture, the contact edge rubs and moves along the terminal lead in one direction in a section ranging from the origin (starting point) to the position where the line is traversed (intermediate point) and rubs and moves along the terminal lead in the opposite direction in a section ranging from the intermediate point to the final point. In other words, it rubs the same location of the connection terminal twice in opposite alternating motion. Accordingly, the maximum amount of the displacement of the contact edge of the contact element as compared with the terminal lead of the electrical part is not the total distance of movement but essentially corresponds to the distance of one way movement.

BRIEF DESCRIPTION OF THE DRAWINGS

Other objects, advantages and details of the novel and improved socket and contact system of the invention appear in the following detailed description of preferred embodiments of the invention, the detailed description referring to the drawings in which.

DETAILED DESCRIPTION OF THE PREFERRED EMBODIMENTS

Figure 5:
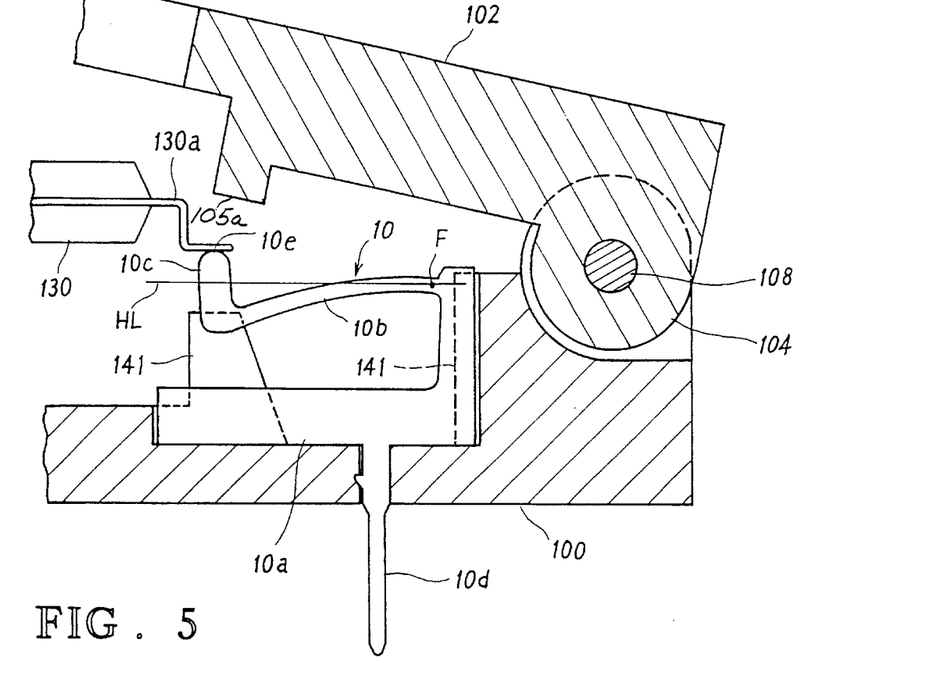
FIG. 5 is a cross sectional view of a portion of a socket showing the state in which an IC package is about to be mounted in or removed from the socket for a burn-in test having a contact system made in accordance with the invention.
Figure 6:
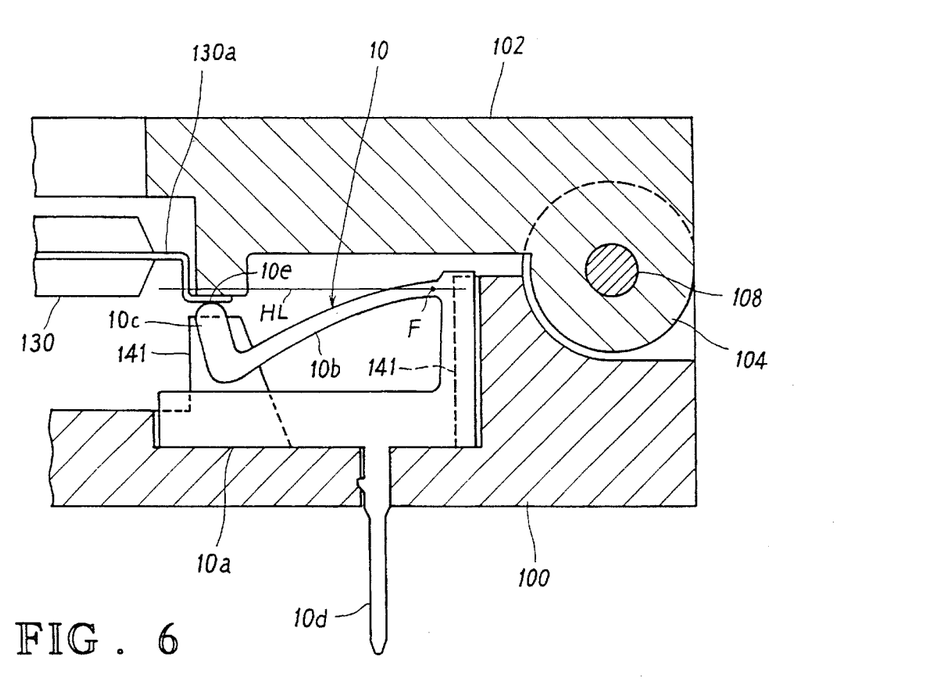
FIG. 6 is a cross sectional view similar to FIG. 5 in which the IC package is mounted ready for the burn-in test.

FIGS. 5 and 6 are cross sectional partial views showing the construction of the essential part of a socket and contact system for burn-in tests made in accordance with a first embodiment of the invention. The socket portion of this embodiment has the same construction as the conventional socket shown in FIGS. 1 and 2 and, as far as those parts, such as the base (main socket body) and the cover, etc. are concerned, are identified with the same numerical designation.

Each contact element (contact maker) in the socket described in this embodiment may be formed by punching a thin sheet of suitable material such as beryllium copper into a generally L-shaped stationary part 10a which is to be fixed to main socket body 100, a cantilever arm-like spring 10b which extends obliquely downwardly from the top of fixed part 10a in a plane in which the contact sheet lies and which is capable of revolving or pivoting in the said plane with the fulcrum F on the base side as the center, a contact part 10c which extends vertically upwardly forming an acute angle with the distal free tip of spring 10b and a socket terminal pin 10d which extends downwardly from the lower edge of the stationary part 10a protruding through the lower surface of base 100. The top portion of contact part 10c functions as a contact edge 10e of contact element 10.

As in the prior art discussed above, when IC package 130 is placed at the IC package mounting position of base 100, the outer tip of each lead 130a of IC package 130 is disposed on the contact edge 10e of a respective contact element 10. As shown in FIG. 5, however, contact edge 10e is at a position which is above the horizontal line HL in which fulcrum F of the spring 10b lies. It is mentioned in this connection that horizontal line HL in this embodiment can be defined in a broad sense of the term as the line which passes through the fulcrum F of spring part 10b and which is approximately perpendicular to the direction of the compressive force exerted from the side of the IC package 130 (electrical part) i.e., exerted through leads 130a.

When cover 102 is closed, a wall member 105a on the inside surface of cover 102 engages the upper surface of the tip of each lead 130a and presses the IC package 130 downwardly in opposition to the spring force of spring parts 10b of contact elements 10. Due to the vertical downward force exerted through leads 130a of IC package 130, the straight cantilever spring parts 10b of the contacts 10 pivot downwardly with fulcrum F as the center, as shown by the dashed line in FIG. 7, with contact edges 10e moving downwardly a prescribed vertical distance of delta y and with respective contact edges 10e and leads 130a being in engagement with each other. The movable parts are designated at an intermediate dashed line position with a prime and at an end dashed line position with a double prime.

Figure 7:
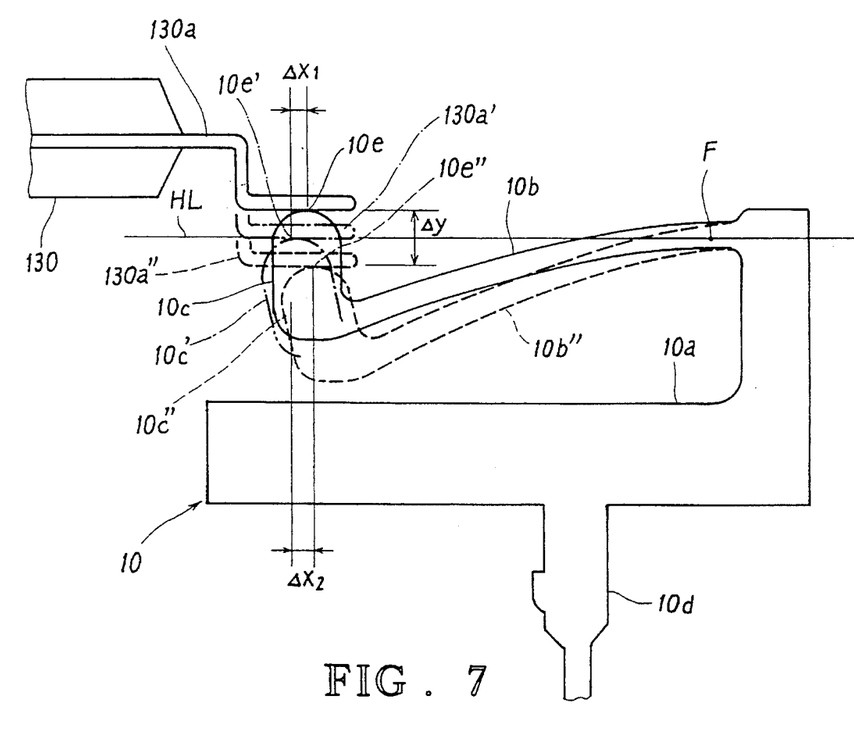
FIG. 7 is an enlarged view showing the function of the contact elements in the FIGS. 5 and 6 embodiment.

At the same time, each contact edge 10e shifts by a horizontal distance of delta x1 toward the base side of lead 130a while rubbing the lead as it descends from the original position to the intermediate vertical position on the horizontal line HL and shifts by delta x2 toward the outer tip side of the lead while rubbing the lead 130a as it descends from the vertical position of the horizontal line HL to the position of the final point.

In this manner, contact edges 10e engage in opposite alternating motion while they continue rubbing leads 130a in the horizontal direction, with the total distance of their movement being equal to delta x1 plus delta x2 and the amount of displacement being equal to delta x1 minus delta x2.

Figure 8:
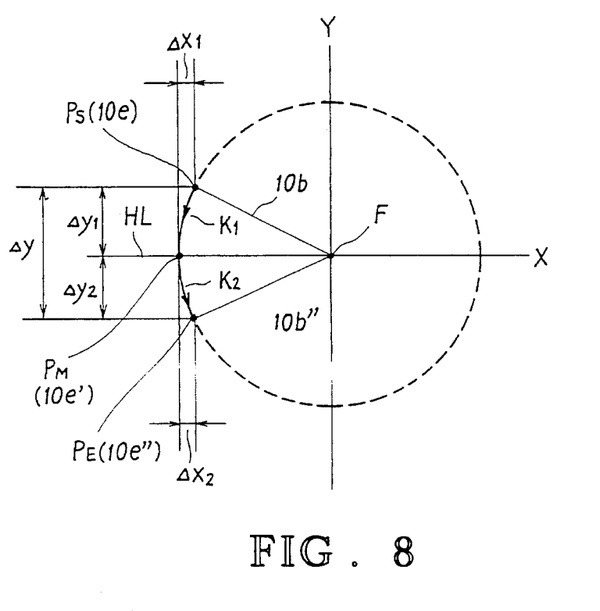
FIG. 8 is a schematic showing a typical orbital movement of the point of engagement of the contact edge of the contact elements in the FIGS. 5–7 embodiment.

FIG. 8 shows a typical orbital path for the movement of the point of engagement of a contact edge 10e of contact element 10 when mounting IC package 130. By the vertical downward force exerted through leads 130a of IC package 130, spring part 10b of contact element 10 pivots downwardly with the fulcrum F as the center and contact edge 10e of contact element 10 moves in the shape of an arc as shown by arrow mark K1. In FIG. 8, spring part 10b, which functions as a pivotable arm, is shown as a straight line.

When this circular arc movement is observed in the horizontal direction (x direction), the direction of movement of the contact edge 10e in section K1 starting from point PS (10e) and ending with intermediate point PM (10e') where it passes the horizontal line HL is opposite compared with section K2 starting from this intermediate point PM (10e') and ending with the final point PE (10e"). In other words, it can be seen that contact edge 10e engages in opposite alternating motion.

If the circular arc lengths of both sections of the distances of the vertical movements (delta y1 and delta y2) are made equal to each other, the distance of movement delta x1 in the forward route and the distance of movement delta x2 in the return route in the horizontal direction (x direction) become equal to each other. It is thus seen that the contact positions of contact edge 10e as compared with lead 130a are the same at the starting point PS (10e) and the ending point PE (10e").

In this manner, spring part 10b of each contact element 10 pivots in a vertical plane which is parallel with the contact sheet surface when IC package 130 is mounted on base 100 in the socket of this embodiment and, while contact edge 10e of each contact maintains engagement with a respective lead 130a of IC package 130, there takes place a movement of the point of engagement across the horizontal line HL in which fulcrum F lies with a result that contact edge 10e rubs the lead 130a in opposite alternating motion.

Because of such rubbing of contact edge 10e in opposite alternating motion (twice), undesirable oxide films are effectively peeled off and removed from the surface of lead 130a. In addition, the maximum amount of displacement of contact edge 10e in the horizontal (x) direction is not the total distance of the movement (delta x1 plus delta x2) but it reflects a small amount of displacement corresponding essentially to the one-way distance of the movement (delta x1). Accordingly, the shearing force that is added to lead 130a is reduced to half and the damage (such as deformation, plate peel-off, etc.) to the lead 130a is minimized.

Further, in the vertical direction (y direction) the desired distance of movement (delta y) of contact edge 10e corresponding to the total distance of movement (delta x1 plus delta x2) in the horizontal direction can be obtained, with a result that the amount of displacement of spring part 10b or the spring return force is maximized. Therefore, a satisfactory electrical connection is obtained with a sufficiently large compressive force between leads 130a and contact elements 10.

Figure 9:
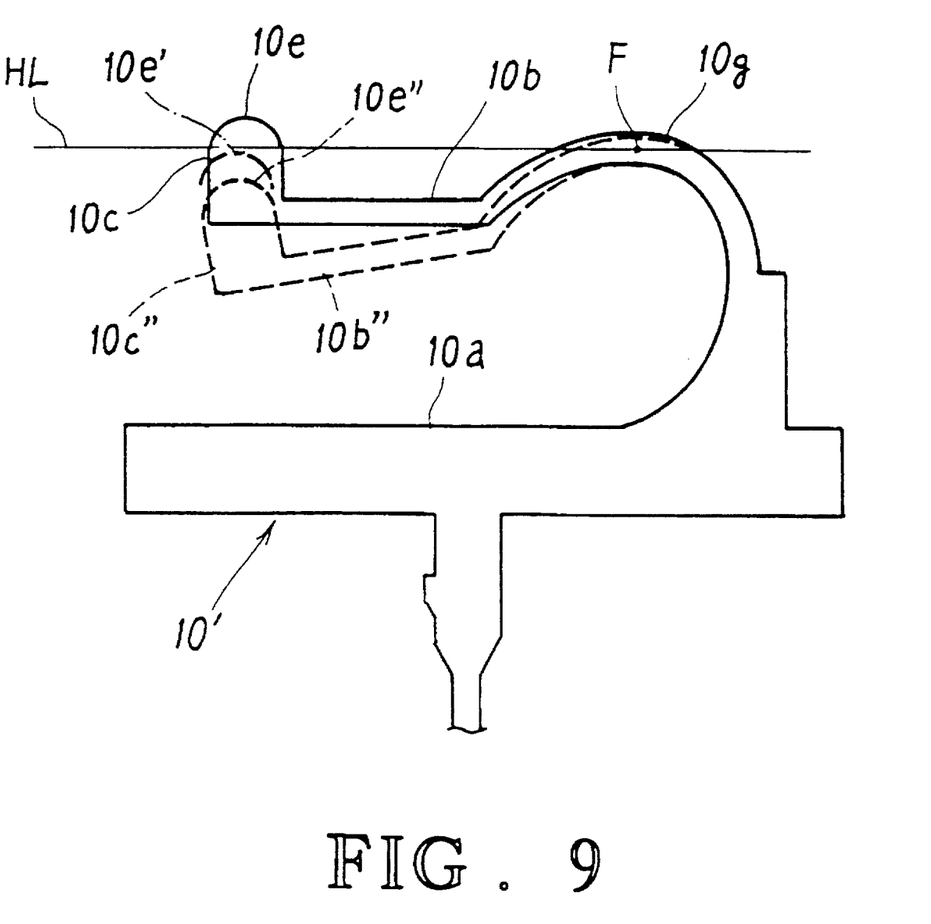
FIG. 9 is a view showing the construction of a contact element of a modified embodiment of the invention.

Although a specific embodiment of the invention has been described above, the invention is not to be limited to this example. It may be modified in different ways within the scope of the invention. The overall shape of the contact element 10 and the shape of each part can be freely altered or modified. As shown in FIG. 9, for example, a curved part 10g may be provided on the base side of spring part 10b of contact element 10'. Further, any suitable material can be used for the contact element.

The shape and material for base 100 and the position of the contact elements 10 inside the base as well as their arrangement and construction can be modified. Moreover, the shape of cover 102, hinge mechanism 104 and the structure and shape of compressive wall member 105a can be modified in various ways.

In addition, this invention can be used for sockets other than those used for burn-in testing such as those used for electrical property testing of inputs and outputs, pulse properties, noise margin, etc. The electrical part used in the described embodiments is an IC package having leads (connection terminals) protruding in four directions. However, this invention can be used with IC packages of other types such as a two-directional flat package or one directional flat package (SIP), etc. In addition, it may be used for electrical parts other than IC packages.

It is the intention that the appended claims be interpreted as broadly as possible in view of the prior art to include all such variations and modifications.

According to the socket of this invention which has been described above, the contact edge of each contact maker inside the main socket body has been made to rub a respective lead of an electrical part in opposite alternating motion in connection with the mounting of the electrical part on the main socket body, with a result that it becomes possible to reduce the amount of movement of the contact edges relative to the electrical lead, thereby preventing deleterious deformation of the electrical leads and obtaining a satisfactory electrical connection.

What is claimed:

1. An electric socket for mounting an electrical part comprising a body, a plurality of contact spring elements mounted in a row in the body, the contact spring elements being spaced from one another by a selected pitch, the contact elements each having a fixed portion and having a cantilever arm extending from the fixed portion about a fulcrum, the arm having a curved portion and contact part with a contact engaging edge at a free distal end movable about said fulcrum, the contact engaging edge of the free distal end having a first at rest position disposed above a horizontal imaginary line passing through the fulcrum, means for controlled movement of the contact engaging edges downward against the contact spring elements including a force applying member movable generally perpendicular to said imaginary line for moving each contact engaging edge from said first at rest position to a second position in which each contact engaging edge is depressed downwardly to a position below said imaginary line, whereby leads of said electrical part extending therefrom mounted in the socket with each of said leads received on a respective contact engaging edge of the free distal end will be rubbed by the contact engaging edge in alternate opposed directions when the force applying member moves from the first at rest position to the second position thereby preventing deleterious deformation of said electrical part leads while assuring good electrical contact between said leads and said contact elements.

2. A socket according to claim 1 in which the contact engaging edge at the first at rest position is disposed a selected distance above the imaginary line which is equal to the distance between the imaginary line and the contact engaging edge when the force applying member is at the second position.

3. A socket according to claim 1 further including a cover pivotably mounted on the body and the force applying member extends downwardly from the cover.

4. A socket according to claim 1 in which the contact engaging edge extends upwardly from the free distal end of each contact element.

5. An electrical socket for mounting an electrical part comprising a body, a plurality of contact spring elements mounted in a row in the body, the contact elements being spaced from one another by a selected pitch, the contact elements each having a fixed portion and having a cantilever arm extending from the fixed portion, the arm having a curved portion and a contact part with a contact engaging edge at a free distal end movable about a fulcrum, the contact engaging edge of the free distal end having a first at rest position disposed a selected distance above a horizontal imaginary line passing through the fulcrum, means for controlled movement of the contact engaging edges downward against the contact spring elements including a force applying member movable generally perpendicular to said imaginary line for moving each contact engaging edge from said first at rest position to a second position in which each contact engaging edge is depressed downwardly to a position below said imaginary line, the selected distance being generally equal to the distance between the imaginary line and the contact engaging edges when the force applying member is at the second position, whereby leads of said electrical part extending therefrom mounted in the socket with each of said leads received on a respective contact engaging edge of a free distal end will be rubbed by the contact engaging edge when the force applying member moves from the first at rest position to the second position in alternate opposed directions thereby preventing deleterious deformation of said electrical part leads while assuring good electrical contact between said leads and said contact elements.

6. A socket according to claim 5 further including a cover pivotably mounted on the body and the force applying member extends downwardly from the cover.

\* \* \* \* \*